US010269759B2

(12) United States Patent
Lin et al.

(10) Patent No.: US 10,269,759 B2
(45) Date of Patent: Apr. 23, 2019

(54) TRACE DESIGN FOR BUMP-ON-TRACE (BOT) ASSEMBLY

(71) Applicant: Taiwan Semiconductor Manufacturing Company, Ltd., Hsinchu (TW)

(72) Inventors: Yen-Liang Lin, Taichung (TW); Chen-Shien Chen, Zhubei (TW); Tin-Hao Kuo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 8 days.

(21) Appl. No.: 15/456,134

(22) Filed: Mar. 10, 2017

(65) Prior Publication Data

US 2017/0186723 A1    Jun. 29, 2017

Related U.S. Application Data

(63) Continuation of application No. 14/143,648, filed on Dec. 30, 2013, now abandoned.

(51) Int. Cl.
*H01L 23/00* (2006.01)
*H01L 23/498* (2006.01)
*H05K 3/34* (2006.01)

(52) U.S. Cl.
CPC ........ *H01L 24/81* (2013.01); *H01L 23/49811* (2013.01); *H01L 24/05* (2013.01); *H01L 24/11* (2013.01); *H01L 24/16* (2013.01); *H05K 3/3436* (2013.01); *H01L 24/13* (2013.01); *H01L 2224/10175* (2013.01); *H01L 2224/131* (2013.01); *H01L 2224/133* (2013.01); *H01L 2224/13013* (2013.01); *H01L 2224/13014* (2013.01); *H01L 2224/13023* (2013.01);
(Continued)

(58) Field of Classification Search
CPC ............................................ H01L 2224/16056
See application file for complete search history.

(56) References Cited

U.S. PATENT DOCUMENTS

2010/0007019 A1    1/2010  Pendse
2010/0164097 A1    7/2010  Pendse
(Continued)

FOREIGN PATENT DOCUMENTS

CN          1526166 B      5/2010
CN        102403239 A      4/2012
(Continued)

*Primary Examiner* — Phat X Cao
*Assistant Examiner* — Diana C Vieira
(74) *Attorney, Agent, or Firm* — Slater Matsil, LLP

(57) ABSTRACT

A bump-on-trace (BOT) interconnection in a package and methods of making the BOT interconnection are provided. An embodiment BOT interconnection comprises a landing trace including a distal end, a conductive pillar extending at least to the distal end of the landing trace; and a solder feature electrically coupling the landing trace and the conductive pillar. In an embodiment, the conductive pillar overhangs the end surface of the landing trace. In another embodiment, the landing trace includes one or more recesses for trapping the solder feature after reflow. Therefore, a wetting area available to the solder feature is increased while permitting the bump pitch of the package to remain small.

20 Claims, 8 Drawing Sheets

(52) U.S. Cl.
CPC ............... *H01L 2224/13147* (2013.01); *H01L 2224/13294* (2013.01); *H01L 2224/16012* (2013.01); *H01L 2224/16013* (2013.01); *H01L 2224/16113* (2013.01); *H01L 2224/16227* (2013.01); *H01L 2224/16238* (2013.01); *H01L 2224/8112* (2013.01); *H01L 2224/81385* (2013.01); *H01L 2224/81447* (2013.01); *H01L 2224/81815* (2013.01); *H01L 2924/12042* (2013.01); *H01L 2924/14* (2013.01); *H01L 2924/381* (2013.01); *H01L 2924/3841* (2013.01); *H05K 2201/10674* (2013.01); *H05K 2203/1173* (2013.01); *Y02P 70/613* (2015.11)

(56) References Cited

U.S. PATENT DOCUMENTS

| | | | | |
|---|---|---|---|---|
| 2010/0193944 | A1* | 8/2010 | Castro | ............... H01L 24/16 257/737 |
| 2011/0074024 | A1* | 3/2011 | Pendse | ............... H01L 21/563 257/737 |
| 2011/0076809 | A1 | 3/2011 | Pendse | |
| 2011/0260321 | A1* | 10/2011 | Pendse | ............... H01L 24/16 257/737 |
| 2011/0304058 | A1 | 12/2011 | Pendse | |
| 2012/0061824 | A1 | 3/2012 | Pagaila et al. | |
| 2013/0001769 | A1 | 1/2013 | Hou et al. | |
| 2013/0127042 | A1 | 5/2013 | Lee et al. | |
| 2013/0270693 | A1* | 10/2013 | Tseng | ............... H01L 23/49838 257/737 |
| 2015/0187719 | A1* | 7/2015 | Lin | ............... H01L 24/11 257/737 |

FOREIGN PATENT DOCUMENTS

| | | |
|---|---|---|
| CN | 102856262 A | 1/2013 |
| TW | 201145419 A | 12/2011 |
| TW | 201306203 A | 2/2013 |

* cited by examiner

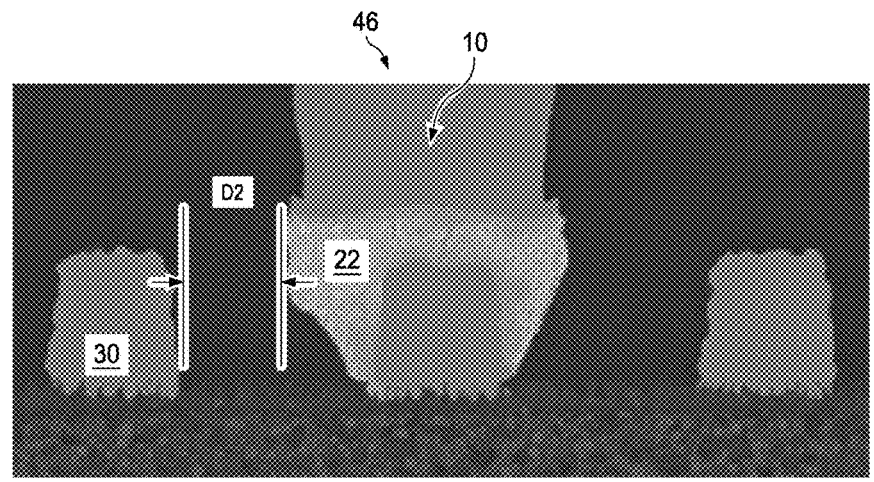
FIG. 11
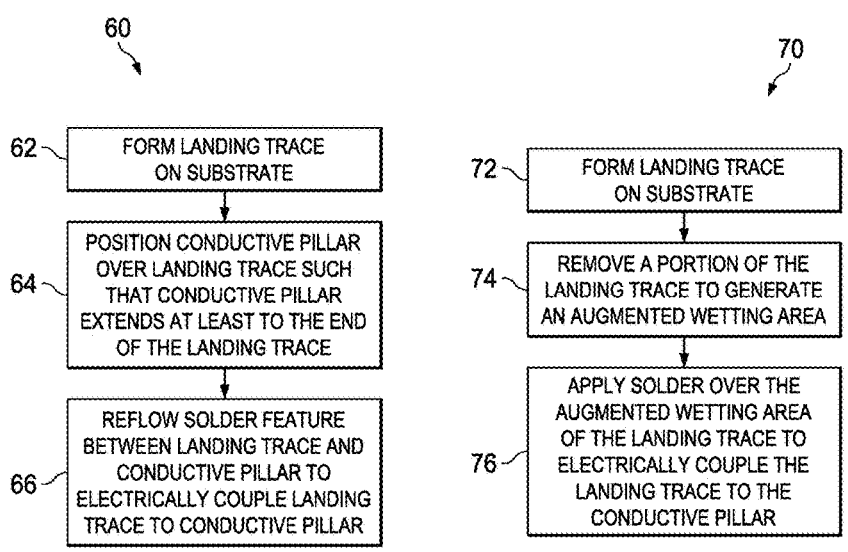
FIG. 12
FIG. 13

TRACE DESIGN FOR BUMP-ON-TRACE (BOT) ASSEMBLY

This application is a continuation application and claims the benefit of U.S. patent application Ser. No. 14/143,648, filed Dec. 30, 2013, entitled "Trace Design for Bump-on-Trace (BOT) Assembly," which application is incorporated herein by reference in its entirety.

BACKGROUND

In a package such as a flip chip Chip Scale Package (fcCSP), an integrated circuit (IC) or die is mounted to a substrate (e.g., a printed circuit board (PCB) or other integrated circuit carrier) through a bump on trace (BOT) interconnection. The BOT interconnection employs solder to electrically couple the bump of the IC to the trace of the substrate.

In light of the demand for ever smaller packages, attempts are often made to reduce the distance between adjacent bumps, which is known as the bump pitch. One way to reduce the bump pitch is by reducing the distance between neighboring metal traces.

Unfortunately, reducing the distance between neighboring metal traces may lead to undesirable or detrimental consequences. For example, if the neighboring metal traces are too close to each other, a solder bridge may form during reflow when the BOT interconnection is established.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 10-11 provide a set of images depicting the increased distance between the solder feature and the neighboring trace in a BOT interconnection and the embodiment BOT assembly of FIG. 1; and FIGS. 12-13 illustrate embodiment methods of forming the BOT assembly of FIG. 1.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

The present disclosure will be described with respect to embodiments in a specific context, namely a package incorporating a bump-on-trace (BOT) interconnection. The concepts in the disclosure may also apply, however, to other packages, interconnection assemblies, or semiconductor structures.

Figure 1:
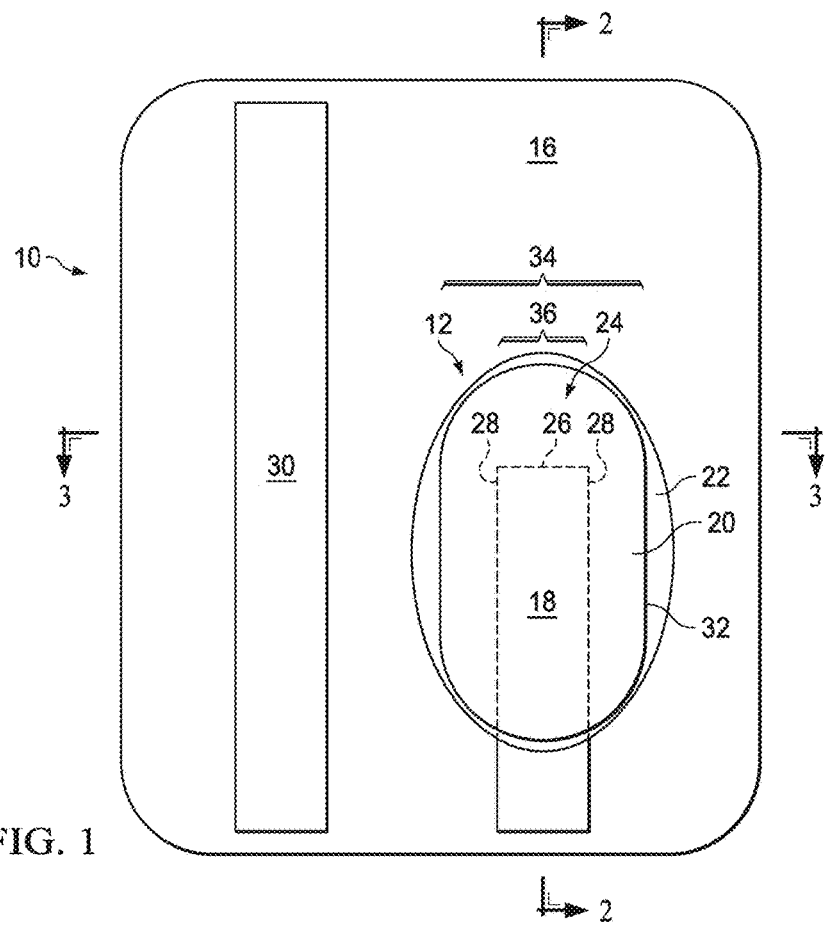
FIG. 1 illustrates a top view of an embodiment bump-on-trace (BOT) assembly in a package (with the die removed) for ease of illustration.
Figure 2:
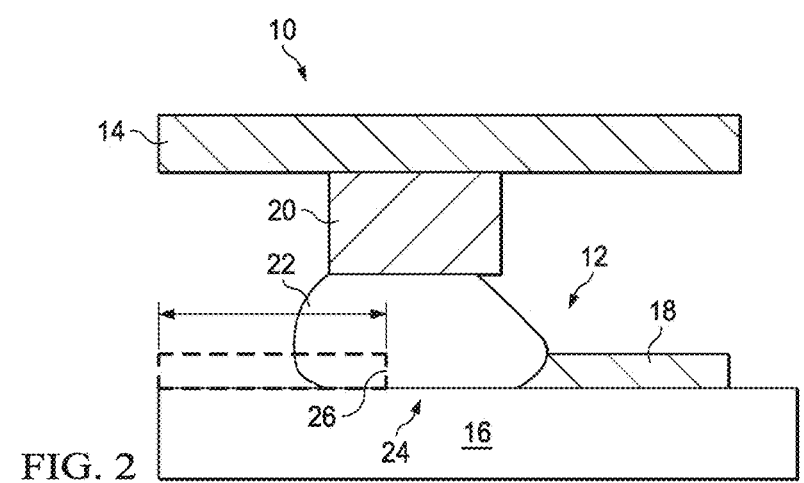
FIG. 2 illustrates a cross section of the embodiment BOT assembly of FIG. 1 taken generally along line 2-2.
Figure 3:
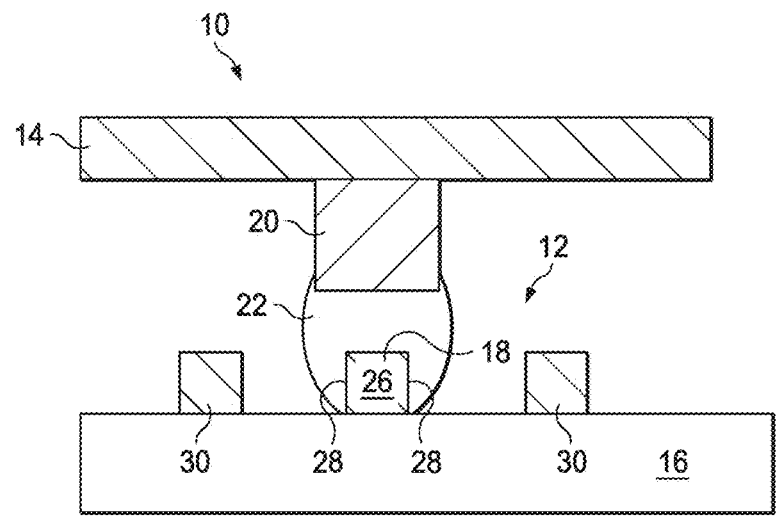
FIG. 3 illustrates a cross section of the embodiment BOT assembly of FIG. 1 taken generally along line 3-3.

Referring collectively to FIGS. 1-3, a bump-on-trace (BOT) assembly 10 for a package 12 is illustrated. As will be more fully explained below, the BOT assembly 10 offers numerous benefits and advantages over BOT assemblies formed using other approaches. For example, the BOT assembly 10 allows solder to more uniformly disperse over the landing trace. By doing so, undesirable solder bridging between adjacent traces in a fine pitch bump design is inhibited or prevented. In addition, the BOT assembly 10 provides a more robust and reliable electrical interconnection for the package 12.

As shown, the BOT assembly 10 is employed to electrically (and, in some embodiments, structurally) couple a die 14 (in FIGS. 2 and 3) to a substrate 16. In an embodiment, the die 14 includes one or more of a variety of different integrated circuits singulated from a wafer. In an embodiment, the substrate 16 may be, for example, a printed circuit board. In some embodiments, the die 14 and the substrate 16 may each include additional components, layers, structures, or features that have been omitted for ease of illustration.

As shown in FIG. 1, the BOT assembly 10 includes a landing trace 18, a conductive pillar 20, and a solder feature 22. The landing trace 18 is adjacent to at least one neighboring trace 30 on the substrate 16. As will be explained below, the landing trace 18 has a reduced length or may be truncated relative to the adjacent neighboring trace 30. In other words, the landing trace 18 may be shorter than the neighboring trace 30.

As shown in FIGS. 2-3, the landing trace 18 is supported by the substrate 16. In an embodiment, the landing trace 18 is entirely disposed above a top surface of the substrate 16. In an embodiment, the landing trace 18 is at least partially embedded into the substrate 16. The landing trace 18 is formed from a conductive metal such as, for example, copper (Cu), but may be suitably formed from other conductive metals.

Referring back to FIG. 1, the landing trace 18 of the BOT assembly 10 includes an end 24 of the landing trace 18. The end 24 may also be referred to a distal end. The end 24 provides an end surface 26 situated between opposing sidewalls 28. In embodiments where the landing trace 18 is shorter than the neighboring trace 30, the distal end 24 of the landing trace 18 is offset from a distal end 24 of the neighboring trace 30. In other words, the landing trace 18 and the neighboring trace 30 are misaligned relative to one another as positioned on the substrate 16.

As shown in FIGS. 2-3, the conductive pillar 20 is coupled to the die 14. The conductive pillar 20 is formed from a conductive metal such as, for example, copper (Cu), but may be suitably formed from other conductive metals. The conductive pillar 20 may be referred to as a bump or an under bump metallization (UBM).

As shown in FIGS. 1-2, the conductive pillar 20 extends to at least the distal end 24 of the landing trace 18 and may extend beyond the distal end 24 in some embodiments. In other words, a periphery 32 of the conductive pillar 20 at least reaches to the end surface 26 of the underlying landing trace 18 as shown in FIG. 1. In an embodiment, the conductive pillar 20 overhangs the underlying landing trace 18 such that the periphery 32 of the conductive pillar 20 projects beyond the end surface 26 of the underlying landing trace 18. In an embodiment, the conductive pillar 20 has a width 34 that is greater than a width 36 of the underlying landing trace 18.

In an embodiment, the landing trace 18 and the conductive pillar 20 may take a variety of suitable shapes. In other words, the landing trace 18 and the conductive pillar 20 are not limited to the shape illustrated in FIGS. 1-3. For example, instead of being rectangular, the landing trace 18 may be square, round, oval, and so on. In addition, instead of being oval, the conductive pillar 20 may be may be rectangular, square, round, and so on.

As shown in FIGS. 1-3, the solder feature 22 (e.g., solder joint) is disposed between and around the conductive pillar 20 and the landing trace 18. As such, the solder feature 22 is able to electrically couple the conductive pillar 20 extending from the die 14 with the landing trace 18 disposed on the substrate 16.

In an embodiment, the solder feature 22 engages and abuts both of the sidewalls 28 of the landing trace 18. In an embodiment, the solder feature 22 also engages and abuts the end surface 26 of the landing trace 18. The solder feature 22 may be a solder paste, a solder ball, or another suitable fusible metal alloy used to join components and having a melting point below that of the components.

Because the conductive pillar 20 extends at least to, and may overhang, the distal end 24 of the landing trace 18 as shown in FIGS. 1-2, the solder feature 22 is allowed to uniformly disperse on both sidewalls 28 of the landing trace 18. With the solder feature 22 disposed along both of the sidewalls 28, the volume of solder on either side of the landing trace 18 is reduced compared to when the solder only wets on one of the two sidewalls 28. In other words, the volume of solder is divided between the two sidewalls 28 instead of accumulating along just one of the sidewalls 28.

Because the volume of solder is shared between the two sidewalls 28 of the landing trace 18, the distance between the solder feature 22 and the neighboring trace 30 is decreased relative to when most or all of the solder feature 22 collects along only the sidewall 28 of the landing trace 18 facing the neighboring trace 30. Therefore, the pitch between the landing trace 18 and the neighboring trace 30 can be reduced to, for example, provide for a smaller overall package 10.

In an embodiment, the volume of solder is shared between the two sidewalls 28 and the end surface 26 of the landing trace 18. In such an embodiment, the distance between the solder feature 22 and the neighboring trace 30 may be even further decreased relative to when the solder feature 22 collects along only the sidewall 28 of the landing trace 18 facing the neighboring trace 30.

In an embodiment, the landing trace 18 may be made smaller than the neighboring trace 30 from the outset. In such circumstances, the portion 38 of the landing trace 18 depicted by dashed lines in FIG. 4 will not have been created. In another embodiment, the landing trace 18 and the neighboring landing trace 18 may have about the same length if there is sufficient room at the distal end 24 of the landing trace 18 to permit the conductive pillar to extend to, or overhang, the distal end 24. In other words, if the distal end 24 of the landing trace 18 is spaced apart from a periphery of the substrate 16 to allow for a solder connection then the landing trace 18 and the neighboring landing trace 18 may have about the same length.

Figure 4:
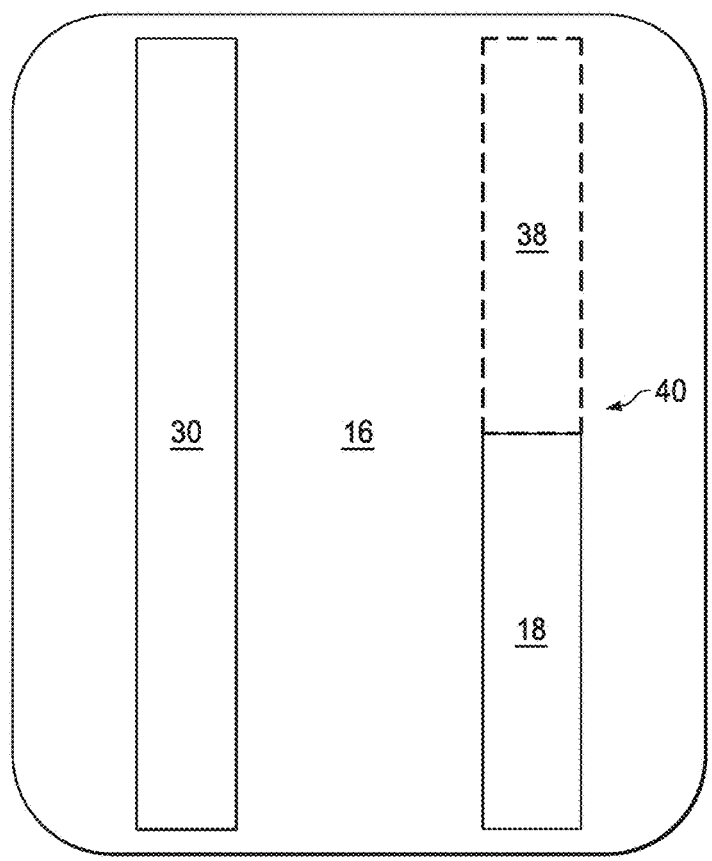
FIGS. 4-6 collectively illustrate an embodiment process flow used to fabricate the embodiment BOT assembly of FIGS. 1-3.
Figure 5:
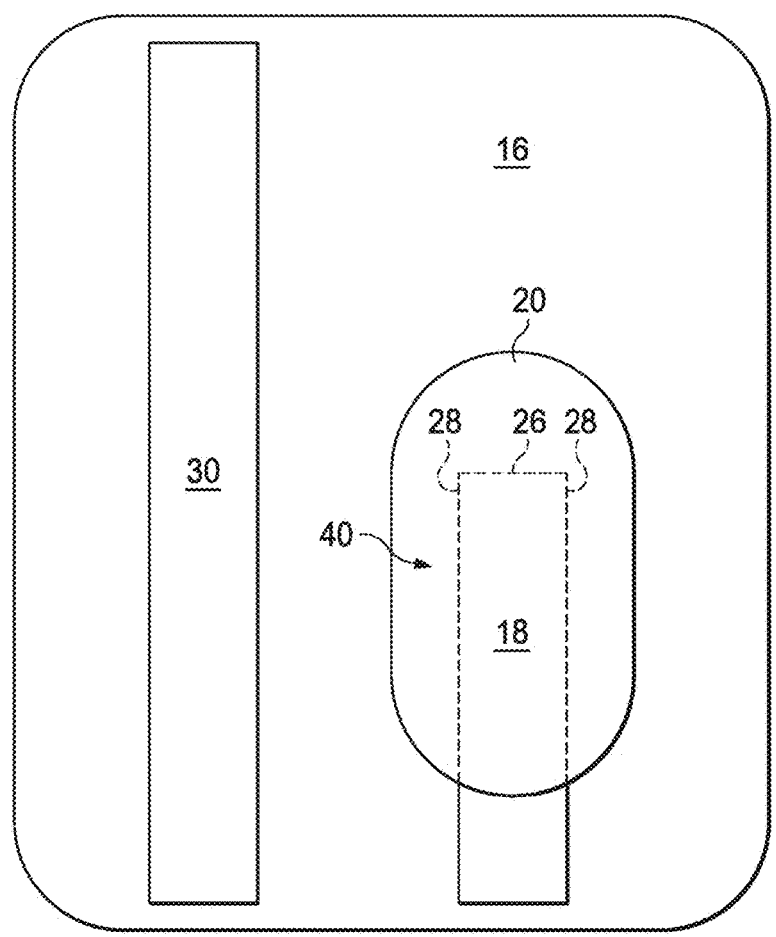
Figure 6:
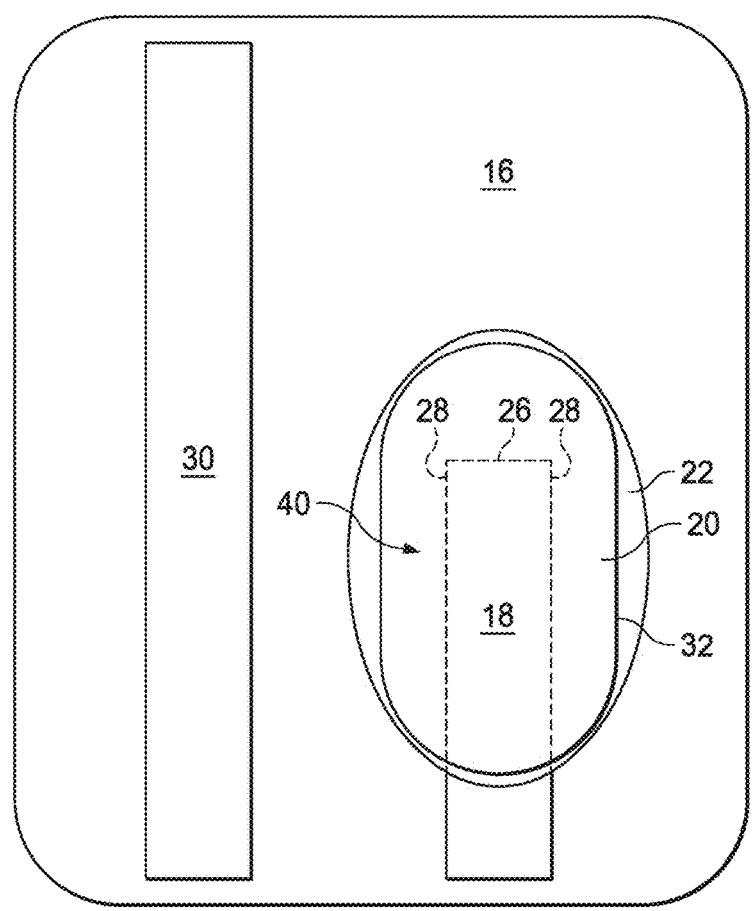

Referring now to FIGS. 4-6, an embodiment process flow used to fabricate the BOT assembly 10 of FIGS. 1-3 is schematically illustrated. As shown in FIG. 4, the landing trace 18 and the neighboring trace 30 are formed on the substrate 16. In an embodiment, a portion 38 (represented by dashed lines) of the landing trace 18 is omitted during the formation process such that the landing trace 18 is shorter in length than the neighboring trace 30.

In an embodiment, the landing trace 18 and the neighboring trace 30 may be initially formed with the same length and, thereafter, the portion 38 may be removed to provide the landing trace 18 with a shorter length. The portion 38 of the landing trace 18 may be removed by, for example, etching. The portion 38 of the landing trace may also be suitably removed by a laser cut, laser burn, selective etching process, a mechanical cut, etc.

Referring now to FIG. 5, when the landing trace 18 is made shorter than the neighboring trace 30 or when the portion 38 of the landing trace 18 has been removed, an augmented wetting area 40 (shown in dashed lines in FIG. 5) is generated or produced. In an embodiment, the augmented wetting area 40 includes the end surface 26 of the landing trace 18. In an embodiment, the augmented wetting area 40 includes the end surface 26 and at least a portion of both of the sidewalls 28 of the landing trace 18. The augmented wetting area 40 provides more area or additional surfaces for the solder feature 22 to disperse over and around.

Referring now to FIG. 5, the conductive pillar 20 is positioned over the landing trace 18. In an embodiment, the conductive pillar 20 extends at least to the distal end 24 of the landing trace 18. In an embodiment, the conductive pillar 20 overhangs the distal end 24 of the landing trace 18. In other words, the periphery 32 of the conductive pillar 20 projects beyond the end surface 26 of the underlying landing trace 18 as shown in FIG. 5.

Referring now to FIG. 6, after the conductive pillar 20 has been positioned, the solder feature 22 initially disposed between the landing trace 18 and the conductive pillar 20 is reflowed. When the solder feature 22 cools, the landing trace 18 is electrically coupled to the conductive pillar 20. In FIG. 6 the solder feature 22 extends along both sidewalls 28 and the end surface 26 of the landing trace 18. Therefore, the extrusion of the solder feature 22 in the direction of the adjacent neighboring trace 30 is reduced relative to the other BOT interconnections.

Figure 7:
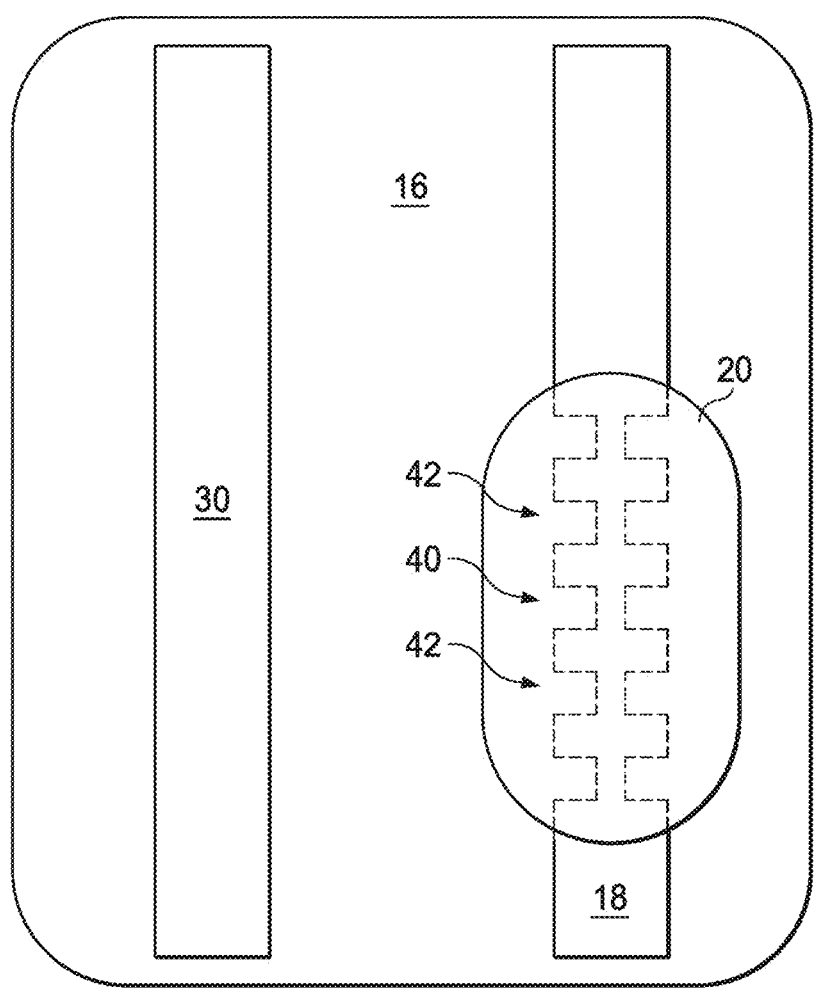
FIGS. 7-8 illustrate recesses that may be formed in the landing trace of the embodiment BOT assembly of FIG. 1.
Figure 8:
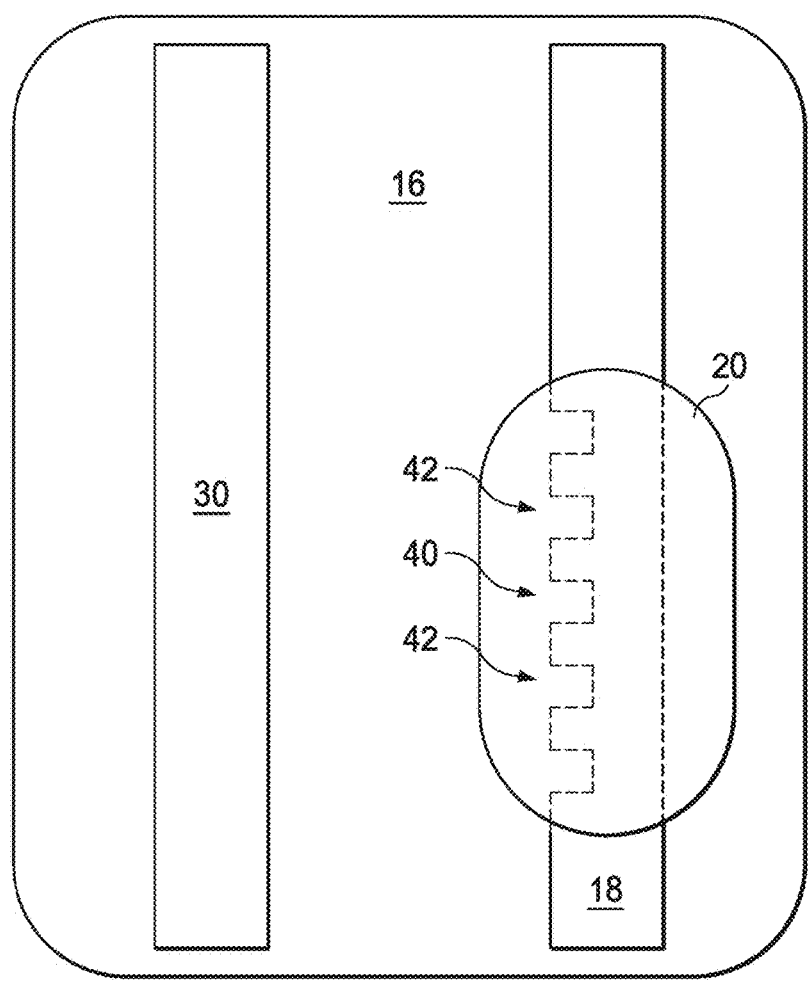

As shown in FIGS. 7-8, in an embodiment one or more recesses 42 may be formed in the landing trace 18 to generate or contribute to the augmented wetting area 40 (shown in dashed lines) of the landing trace 18. In other words, the recesses 42 may be formed in the landing trace 18 instead of, or in addition to, removal of the portion 38 of the landing trace 18 shown in FIG. 4. The recesses 42 in the landing trace 18 provide an area for the solder feature 22 to occupy upon reflow. As such, the extrusion of the solder feature 22 in the direction of the adjacent neighboring trace 30 is reduced relative to the other BOT interconnections.

As shown in FIG. 7, the recesses 42 may be formed in a "fish bone" pattern. As shown in FIG. 8, the recesses 42 may be formed in a "comb" pattern. The recesses 42 may also be formed in a variety of other suitable patterns. For example, the recesses 42 may be formed in symmetrical or asymmetrical patterns, patterns that have even or uneven spacing between recesses 42, and so on. In addition, the recesses 42 may have a variety of suitable shapes. For example, the recesses 42 may be square, rectangular, semi-circular, oval, and so on.

Figure 9:
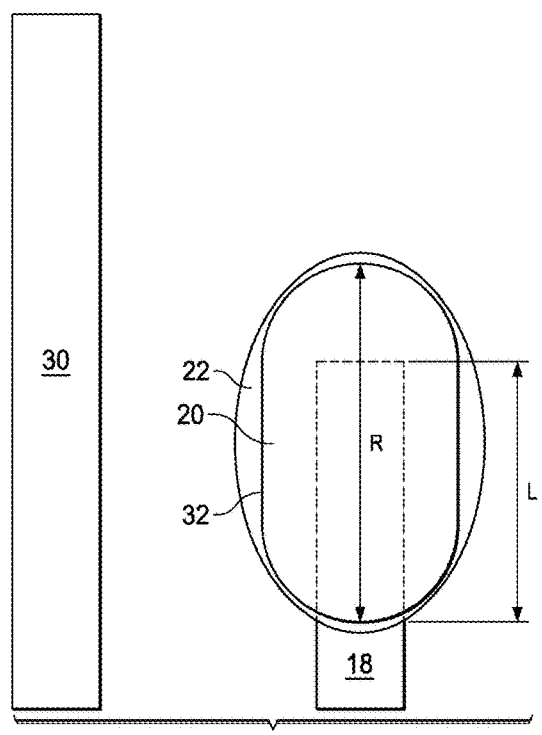
FIG. 9 illustrates dimensions of the conductive pillar relative to the portion of the landing trace beneath the conductive pillar.

Referring now to FIG. 9, the neighboring trace 30 is depicted laterally adjacent to the landing trace 18. As shown, the solder feature 22 and the conductive pillar 20 are illustrated over the landing trace 18. The conductive pillar 20 has a diameter, R. The landing trace 18 has a length, L, which represents the portion of the landing trace 18 within the periphery 32 of the conductive pillar 20.

In an embodiment, the length, L, of the landing trace 18 within the periphery 32 of the conductive pillar 20 is about 20% to about 100% of the diameter, R, of the conductive pillar 20. The 20% lower limit was selected because the total assembly process variation is around 20% of the diameter, R, of the conductive pillar 20. Therefore, in order to ensure that the conductive pillar 20 has a suitable joint on the landing trace 18, the length, L, of the landing trace 18 is suggested to be 20% or more of the diameter, R, of the conductive pillar 20. If not, an electric open may be encountered after the assembly process because the conductive pillar 20 does not contact on landing trace 18. In an embodiment, the conductive pillar 20 is positioned such that the length, L, of the landing trace 18 within the periphery 32 of the conductive pillar 20 is less than 100% of the diameter, R, of the conductive pillar 20. In other words, the equation $\frac{1}{5}R \leq L \leq R$ is satisfied.

Figure 10:
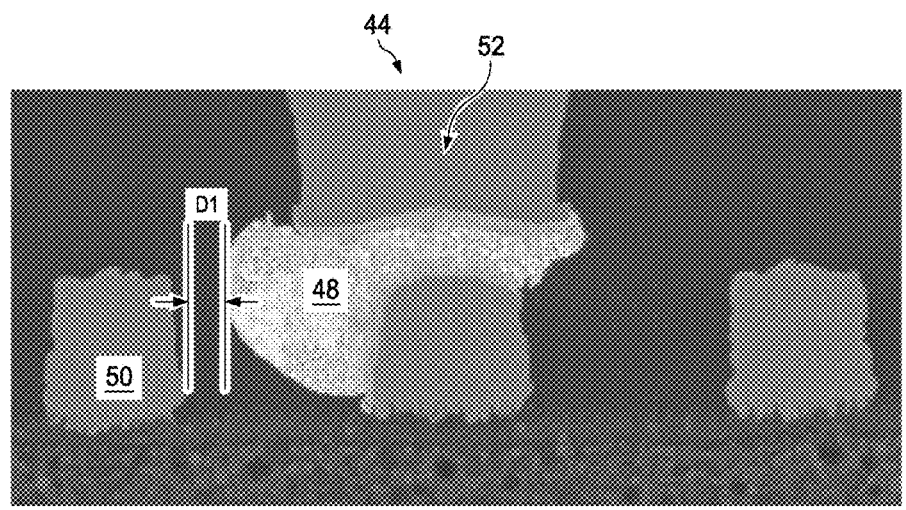

Referring now to FIGS. 10-11, a first image 44 and a second image 46 illustrate the increased distance between the solder feature and the neighboring trace when the process described herein is utilized. Indeed, as shown in FIG. 10, a distance, D1, between the solder feature and the neighboring trace in the BOT interconnection 52 is less than a distance, D2, between the solder feature and the neighboring trace using the embodiment BOT assembly 10. In other words, the distance, D2, in FIG. 11 far exceeds the distance, D1, in FIG. 10 because the solder feature 22 is encouraged to wet along both sidewalls in the BOT assembly 10 of FIG. 11.

In FIG. 12, a method 60 of forming the BOT assembly 10 is illustrated. In block 62, the landing trace 18 is formed on the substrate 16. In block 64, the conductive pillar 20 is positioned over the landing trace 18 such that the conductive pillar 20 extends at least to the end 24 of the landing trace 18. In block 66, the solder feature 22 between the landing trace 18 and the conductive pillar 20 is reflowed to electrically couple the landing trace 18 to the conductive pillar 20.

In FIG. 13, a method 70 of forming the BOT assembly 10 is illustrated. In block 72, the landing trace 18 is formed on the substrate 16. In block 74, a portion of the landing trace 18 is removed to generate an augmented wetting area 40. In block 76, solder is applied over the augmented wetting area 40 of the landing trace 18 to electrically couple the landing trace to the conductive pillar 20.

From the foregoing, those of ordinary skill in the art will recognize that the BOT assembly 10 controls or minimizes solder extrusion. Moreover, the BOT assembly 10 enables solder to more uniformly disperse over the landing trace. Therefore, the potential for the formation of a solder bridge is reduced in fine bump pitch packages. In other words, undesirable solder bridging between adjacent traces in a fine pitch bump (I/O) design is inhibited or prevented. In addition, BOT assembly 10 provides a more robust and reliable electrical interconnection for the package 12 by changing existing trace pattern design without substantial additional process cost.

An embodiment method of forming a bump-on-trace (BOT) assembly includes forming a landing trace on a substrate, positioning a conductive pillar over the landing trace such that the conductive pillar extends at least to an end of the landing trace, and reflowing a solder feature between the landing trace and the conductive pillar to electrically couple the landing trace to the conductive pillar.

An embodiment method of forming a bump-on-trace (BOT) assembly includes forming a landing trace on a substrate, removing a portion of the landing trace to generate an augmented wetting area, and applying solder over the augmented wetting area of the landing trace to electrically couple the landing trace to a conductive pillar.

An embodiment bump-on-trace (BOT) interconnection for a package includes a landing trace including a distal end, a conductive pillar extending at least to the distal end of the landing trace, and a solder feature electrically coupling the landing trace and the conductive pillar.

While the disclosure provides illustrative embodiments, this description is not intended to be construed in a limiting sense. Various modifications and combinations of the illustrative embodiments, as well as other embodiments, will be apparent to persons of ordinary skill in the art upon reference to the description. It is therefore intended that the appended claims encompass any such modifications or embodiments.

What is claimed is:

1. A method of forming a bump-on-trace (BOT) assembly, the method comprising:
   forming a landing trace on a substrate, the landing trace having a first portion, a second portion, and a third portion connecting the first portion to the second portion in a plan view, a first sidewall of the first portion being collinear with a first sidewall of the second portion and a first sidewall of the third portion in the plan view, a second sidewall of the first portion being collinear with a second sidewall of the second portion and a second sidewall of the third portion in the plan view, the second portion having a plurality of indents in the plan view, wherein the plurality of indents are in the first sidewall of the second portion, the second sidewall of the second portion being free of indents;
   positioning a conductive pillar over the second portion of the landing trace such that the conductive pillar completely overlies the plurality of indents in the second portion of the landing trace; and
   reflowing a solder feature between the landing trace and the conductive pillar to electrically couple the landing trace to the conductive pillar.

2. The method of claim 1, further comprising positioning the conductive pillar such that a length of the landing trace within a conductive pillar periphery is about 20% to about 100% of a diameter of the conductive pillar.

3. The method of claim 1, further comprising positioning the conductive pillar such that a width of the landing trace within a conductive pillar periphery is less than a diameter of the conductive pillar.

4. The method of claim 1, wherein the solder feature extends into the plurality of indents.

5. The method of claim 1, wherein the plurality of indents have a comb pattern.

6. The method of claim 1, wherein the solder feature extends along the second sidewall of the second portion of the landing trace.

7. The method of claim 1, wherein the solder feature extends along sidewalls of the plurality of indents.

8. A method of forming a bump-on-trace (BOT) assembly, the method comprising:
   forming a landing trace on a substrate, the landing trace having a first portion, a second portion, and a third portion connecting the first portion to the second portion in a plan view, a first sidewall of the first portion being collinear with a first sidewall of the second portion and a first sidewall of the third portion in the plan view, a second sidewall of the first portion being collinear with a second sidewall of the second portion and a second sidewall of the third portion in the plan view, the first sidewall of the second portion having one or more indents in the plan view, the second sidewall of the second portion being free of indents, the one or more indents having sidewalls perpendicular to the first sidewall of the second portion;

positioning a conductive pillar over the second portion of the landing trace such that the conductive pillar completely overlies the one or more indents in the second portion of the landing trace; and electrically coupling the landing trace to the conductive pillar.

9. The method of claim 8, wherein the electrically coupling comprises reflowing a solder feature between the landing trace and the conductive pillar.

10. The method of claim 9, wherein the solder feature contacts opposing sidewalls of the second portion of the landing trace.

11. The method of claim 9, wherein the solder feature contacts opposing sidewalls of the one or more indents.

12. The method of claim 9, wherein the solder feature fills the one or more indents.

13. The method of claim 8, wherein the conductive pillar is oblong.

14. A method of forming a bump-on-trace (BOT) assembly, the method comprising:

forming a landing trace on a substrate, the landing trace having a first portion, a second portion, and a third portion connecting the first portion to the second portion in a plan view, a first sidewall of the first portion being collinear with a first sidewall of the second portion and a first sidewall of the third portion, a second sidewall of the first portion being collinear with a second sidewall of the second portion and a second sidewall of the third portion, the first sidewall of the second portion having one or more first indents extending toward the second sidewall in the plan view, an entirety of the second sidewall of the second portion being a planar sidewall;

positioning a conductive pillar over the second portion of the landing trace such that the conductive pillar at least partially overlies the one or more first indents in the second portion of the landing trace; and electrically coupling the landing trace to the conductive pillar.

15. The method of claim 14, wherein the electrically coupling is performed at least in part by coupling the landing trace to the conductive pillar using a solder feature.

16. The method of claim 15, wherein the solder feature extends along a surface of the landing trace, the surface of the landing trace intersecting the substrate.

17. The method of claim 16, wherein the solder feature extends to the substrate.

18. The method of claim 17, wherein the solder feature extends along sidewalls of each of the one or more first indents of the second portion.

19. The method of claim 15, wherein the solder feature is in physical contact with the substrate.

20. The method of claim 14, wherein the first sidewall of the second portion has a plurality first indents.

* * * * *